United States Patent
Chen et al.

(10) Patent No.: US 10,032,673 B1
(45) Date of Patent: Jul. 24, 2018

(54) SEMICONDUCTOR DEVICES AND METHODS FOR MANUFACTURING THE SAME

(71) Applicant: Vanguard International Semiconductor Corporation, Hsinchu (TW)

(72) Inventors: Li-Che Chen, Hsinchu (TW); Chien-Wei Chiu, Beigang Township (TW); Chien-Hsien Song, Kaohsiung (TW)

(73) Assignee: Vanguard International Semiconductor Corporation, Hsinchu (TW)

(*) Notice: Subject to any disclaimer, the term of this patent is extended or adjusted under 35 U.S.C. 154(b) by 0 days.

(21) Appl. No.: 15/607,976

(22) Filed: May 30, 2017

(51) Int. Cl.
*H01L 21/8234* (2006.01)
*H01L 27/06* (2006.01)
*H01L 29/41* (2006.01)

(52) U.S. Cl.
CPC ........ *H01L 21/823462* (2013.01); *H01L 21/823437* (2013.01); *H01L 27/0629* (2013.01); *H01L 29/413* (2013.01)

(58) Field of Classification Search
CPC ..... H01L 21/823462; H01L 21/823437; H01L 27/0629; H01L 29/413
See application file for complete search history.

(56) References Cited

U.S. PATENT DOCUMENTS

| | | | | |
|---|---|---|---|---|
| 2003/0194840 A1* | 10/2003 | Murata | ............ | H01L 21/28518 438/241 |
| 2004/0047217 A1* | 3/2004 | Kamiya | ................ | H01L 27/105 365/221 |
| 2004/0048435 A1* | 3/2004 | Kim | ................ | H01L 21/823462 438/239 |
| 2011/0309372 A1* | 12/2011 | Xin | ..................... | H01L 27/0605 257/76 |
| 2015/0060994 A1* | 3/2015 | Kato | ................... | H01L 29/4234 257/326 |
| 2015/0295018 A1* | 10/2015 | Lao | ......................... | H01L 28/60 257/506 |

FOREIGN PATENT DOCUMENTS

CN            101286477 A      10/2008

* cited by examiner

*Primary Examiner* — Walter H Swanson
(74) *Attorney, Agent, or Firm* — Birch, Stewart, Kolasch & Birch, LLP

(57) ABSTRACT

A method for manufacturing a semiconductor device includes forming a first gate structure on a semiconductor substrate. The first gate structure includes a first gate dielectric layer and a first gate electrode layer formed thereon. The method also includes forming an insulating material layer on the semiconductor substrate, wherein the semiconductor substrate and the first gate structure are covered by the insulating material layer. The method further includes removing a portion of the insulating material layer in a high-voltage element region to form a second gate dielectric layer in the high-voltage element region on the semiconductor substrate, and forming a second gate electrode layer on the second gate dielectric layer.

17 Claims, 5 Drawing Sheets

SEMICONDUCTOR DEVICES AND METHODS FOR MANUFACTURING THE SAME

BACKGROUND OF THE INVENTION

Field of the Invention

The invention relates to semiconductor devices, and in particular to high-voltage elements and methods for forming the same.

Description of the Related Art

Semiconductor integrated circuit (IC) industry has been developed rapidly during the past decades. As semiconductor devices continue to scale to smaller sizes by following Moore's law, the operation speed and the processing technique of the devices are continuously being improved. In addition, in order to achieve a more diverse and high-performance design, the need for applying high-voltage elements to the electronic products is increased gradually. In manufacturing processes of high-voltage elements, the semiconductor integrated circuit industry has been constantly improved in terms of the design of materials and manufacturing processes, so as to shrink the size of the devices, reduce the cost, and provide the best performance of the components.

Although existing semiconductor devices and methods for forming the same have been adequate for their intended purposes, they have not been entirely satisfactory in all respects. Therefore, there are still some problems to be overcome in regards to semiconductor integrated circuits and technology.

BRIEF SUMMARY OF THE INVENTION

Some embodiments of the disclosure provide a method for forming a semiconductor device. The method includes forming a first gate structure on a semiconductor substrate, wherein the first gate structure comprises a first gate dielectric layer and a first gate electrode layer formed thereon. The method also includes forming an insulating material layer on the semiconductor substrate, wherein the semiconductor substrate and the first gate structure are covered by the insulating material layer. The method further includes removing a portion of the insulating material layer in a high-voltage element region to form a second gate dielectric layer in the high-voltage element region on the semiconductor substrate, and forming a second gate electrode layer on the second gate dielectric layer.

Some embodiments of the disclosure provide a semiconductor device. The semiconductor device includes a first gate structure disposed on a semiconductor substrate, wherein the first gate structure comprises a first gate dielectric layer and a first gate electrode layer located thereon. The semiconductor device also includes a first insulating layer disposed on the semiconductor substrate, wherein the first gate structure and a portion of the semiconductor substrate are covered by the first insulating layer. The semiconductor device further includes a second gate dielectric layer disposed on the semiconductor substrate, wherein the first insulating layer and the second gate dielectric layer are formed by an insulating material layer, and the second gate dielectric layer has a thickness that is greater than the thickness of the first gate dielectric layer. In addition, the semiconductor device includes a second gate electrode layer disposed on the second gate dielectric layer.

Some embodiments of the disclosure provide a semiconductor device. The semiconductor device includes a gate dielectric layer disposed on a semiconductor substrate. The semiconductor device also includes a metal gate electrode layer disposed on the gate dielectric layer, wherein the gate dielectric layer and the metal gate electrode layer constitute a gate structure. The semiconductor device further includes a source region and a drain region respectively disposed on opposite sides of the gate structure, wherein the gate structure is a gate structure of a high-voltage element.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1:
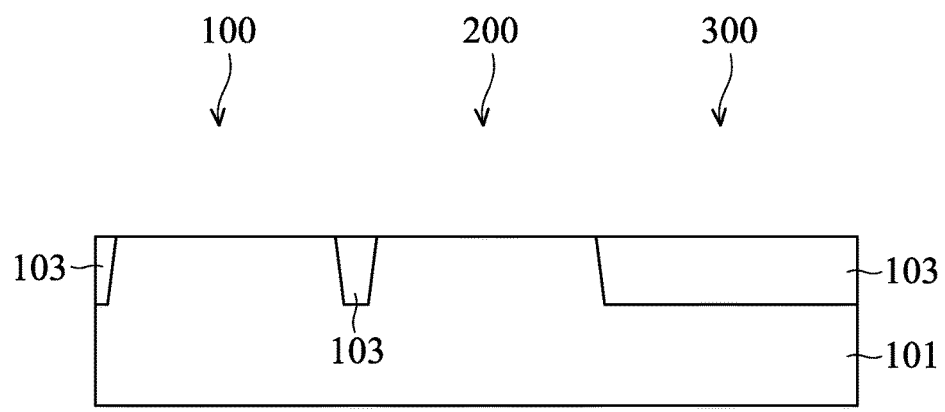
FIGS. 1 to 6 are cross-sectional views illustrating an exemplary sequential formation process of a semiconductor device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

Some embodiments of the present disclosure provide methods for forming high-voltage elements by parasitic method in the manufacturing process of semiconductor devices with metal-insulator-polysilicon (MIP) structures, for example, transistors that can withstand high gate voltages. By using the foregoing method, semiconductor devices having both low-voltage elements and high-voltage elements can be formed. In the meantime, the quantity of the masks needed during the process can be reduced, so that the manufacturing cost can be reduced significantly.

Embodiments for forming a semiconductor device are provided. FIGS. 1 to 6 are cross-sectional views illustrating an exemplary sequential forming process of the semiconductor device 100 shown in FIG. 6 in accordance with some embodiments.

As shown in FIG. 1, some isolation structures 103 are formed in the semiconductor substrate 101. In some embodiments, the semiconductor substrate 101 may be made of silicon or another semiconductor material. Alternatively, the semiconductor substrate 101 may include other elementary semiconductor materials such as germanium (Ge). In some embodiments, the semiconductor substrate 101 is made of a compound semiconductor such as silicon carbide (SiC), gallium nitride (GaN), gallium arsenic (GaAs), indium arsenide (InAs), or indium phosphide (InP). In some embodiments, the semiconductor substrate 101 is made of an alloy semiconductor such as silicon germanium, silicon germanium carbide, gallium arsenic phosphide, or gallium indium phosphide. In some embodiments, the semiconductor substrate 101 may include a silicon-on-insulator (SOI) substrate.

Referring to FIG. 1, the isolation structures 103 are configured to define active regions of a low-voltage element region 100 and a high-voltage element region 200, and the capacitor element 300 is located on a portion of the isolation structures 103. The isolation structures 103 may be formed by using local oxidation of silicon (LOCOS) isolation technology or shallow trench isolation (STI) technology. When the isolation structures 103 are the STI structures, rather than the LOCOS structures, the isolation structures 103 can be formed by an etching process instead of an oxide process. Therefore, the size of the semiconductor device can be further decreased. In some embodiments, the isolation structures 103 are made of silicon oxide, silicon nitride, silicon oxynitride or another suitable dielectric material.

Figure 2:
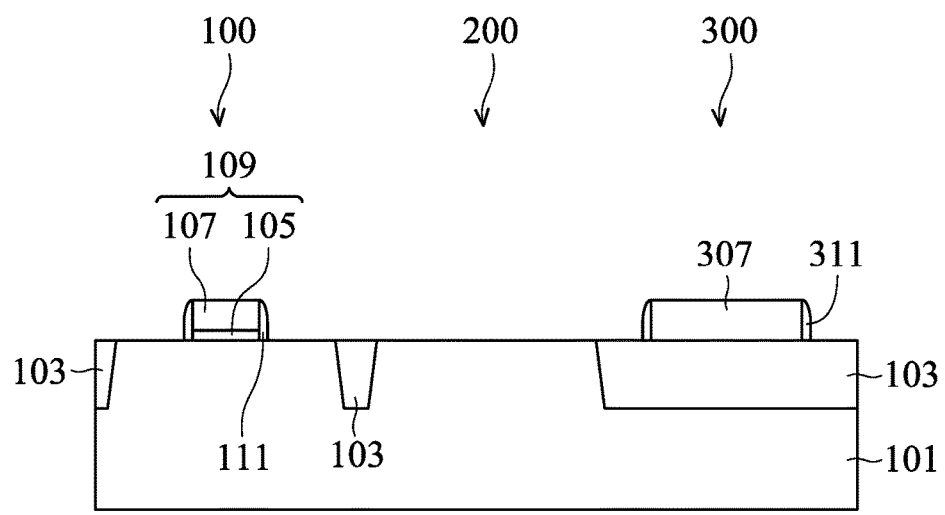

As shown in FIG. 2, in accordance with some embodiments, a first gate dielectric layer 105 is formed on the semiconductor substrate 101 and in the active region of the low-voltage element region 100 defined by the isolation structures 103. In the present embodiment, the first gate dielectric layer 105 can be formed by using a thermal oxidation process and a patterning process. In other embodiments, the first gate dielectric layer 105 can be formed by using a chemical vapor deposition (CVD) process, a physical vapor deposition (PVD), an atomic layer deposition (ALD), another suitable process and a patterning process. In addition, the first gate dielectric layer 105 may be made of silicon oxide, silicon nitride, silicon oxynitride, high k dielectric materials, another suitable material or a combination thereof.

Next, a polysilicon layer (not shown) is formed on the semiconductor substrate 101, and an etching process, such as a dry etching process, a wet etching process, a plasma etching process, a reactive ion etching (RIE) process or another suitable etching process, is performed on the polysilicon layer to form patterned first gate electrode layer 109 on the first gate dielectric layer 105, and a patterned polysilicon electrode 307 on a portion of the isolation structures 103 in the capacitor element region 300. The first gate dielectric layer 105 and the first gate electrode layer 107 constitute a first gate structure 109. The first gate structure 109 is located in the low-voltage element region 100, and the polysilicon electrode 307 is located in the capacitor element region 300.

Next, referring to FIG. 2, spacers 111 and 311 are respectively formed on sidewalls of the first gate structure 109 and the polysilicon electrode 307 by a deposition process and an etching process. In some embodiments, the spacers 111 and 311 are formed by conformally depositing a spacer layer (not shown), and then, patterning the spacer layer to form the spacers 111 and 311, such as performing an anisotropic etching process to remove the spacer layer from the horizontal surface of the structured formed previously. Moreover, the spacers 111 and 311 may comprise silicon nitride (SiN), silicon oxynitride, silicon carbide (SiC), silicon oxycarbide (SiON), oxide or another suitable material, and the spacers 111 and 311 are formed by using a chemical vapor deposition (CVD) process, a plasma enhanced chemical vapor deposition (PECVD) process, a sputtering process, or another suitable deposition process.

Figure 3:
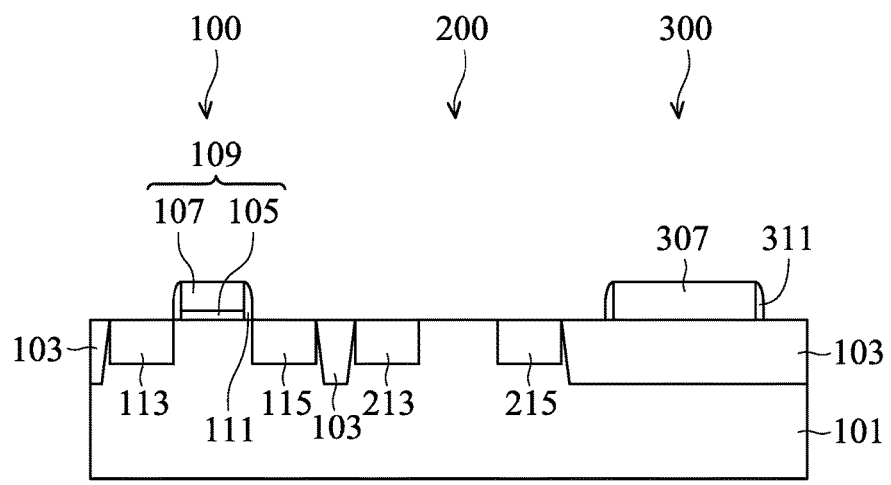

As shown in FIG. 3, in accordance with some embodiments, a first source region 113 and a first drain region 115 are formed in the semiconductor substrate 101 and in the low-voltage element region 100, and the first source region 113 and the first drain region 115 are formed on opposite sides of the first gate structure 109. Moreover, a second source region 213 and a second drain region 215 are formed in the semiconductor substrate 101 of the high-voltage element region 200. In the present embodiment, the semiconductor substrate 101 is a p-type substrate, and the first source region 113, the first drain region 115, the second source region 213 and the second drain region 215 are formed by implanting suitable n-type dopants, such as phosphorous (P), arsenic (As) or the like. In another embodiment, the semiconductor substrate 101 is a n-type substrate, and the first source region 113, the first drain region 115, the second source region 213 and the second drain region 215 are formed by implanting suitable p-type dopants, such as phosphorous boron (B), gallium (Ga), Indium (In) or the like.

It is important to note that the first source region 113 and the first drain region 115 are formed by implanting dopants that utilizing the first gate structure 109 and the spacer 111 as a mask. The second source region 213 and the second drain region 215 are formed by forming a mask (not shown) in the semiconductor substrate 101 of the high-voltage element region 200, and then, removing the mask after performing a doping process. A space between the second source region 213 and the second drain region 215 is preserved for a gate structure which will be formed subsequently.

Figure 4:
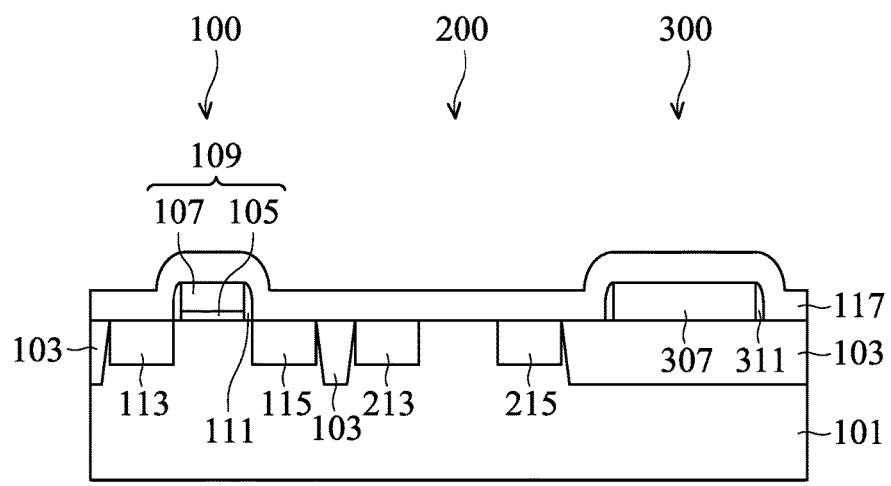

As shown in FIG. 4, in accordance with some embodiments, an insulating material layer 117 is formed on the semiconductor substrate 101 to conformally cover the first gate structure 109 and the polysilicon electrode 307. Moreover, the first source region 113, the first drain region 115, the second source region 213 and the second drain region 215 of the semiconductor substrate 101 are further covered by the insulating material layer 117. In some embodiments, the insulating material layer 117 may comprise an oxynitride layer, an oxide layer (for example, plasma enhanced oxide), a structure of stacked oxide-nitride-oxide layers, high k dielectric material layers, or other suitable insulating materials. Moreover, the insulating material layer 117 may be formed by a deposition process, such as a chemical vapor deposition (CVD) process, a plasma enhanced chemical vapor deposition (PECVD) process, a sputtering process or another suitable process.

It is important to note that the thickness of the insulating material layer 117 is greater than the thickness of the first gate dielectric layer 105 in the low-voltage element region 100. In some embodiments, the thickness of the insulating material layer 117 is in a range from about 300 Å to about 1200 Å.

Figure 5:
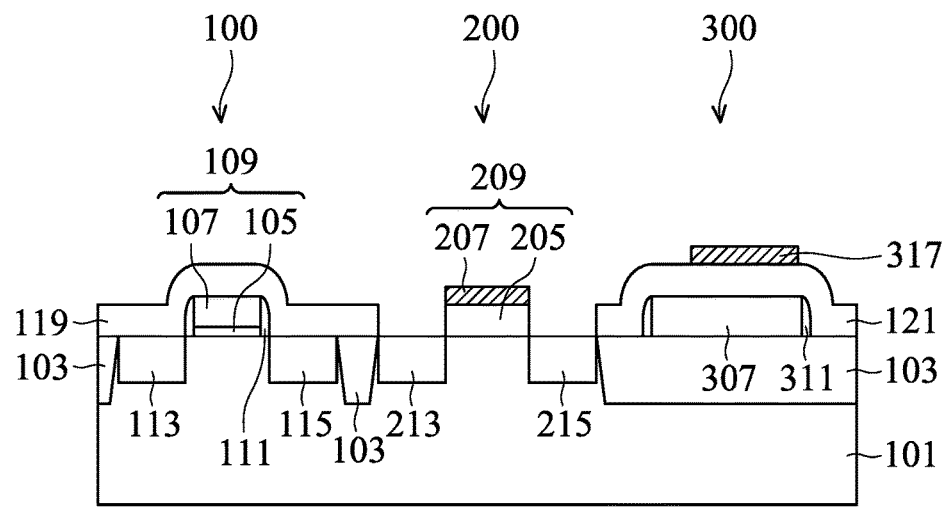

Next, referring to FIG. 5, a patterning process is performed to the insulating material layer 117, such as an etching process, to remove the portions of the insulating material layer 117 covering the second source region 213 and the second drain region 215 in the high-voltage element region 200, so that an insulating layer 119 of the low-voltage element region 100, a second gate dielectric layer 205 of the high-voltage element region 200 and an insulating layer 121 of the capacitor element region 300 are formed.

Then, a deposition process is performed to form a metal layer (not shown) comprehensively covering the insulating layers 119, 121 and on the second gate dielectric layer 205, and an etching process is performed to the metal layer to form a second gate electrode layer 207 on the second gate dielectric layer 205, and to form a metal electrode 317 on the insulating layer 121. The second gate dielectric layer 205 and the second gate electrode layer 207 constitute the second gate structure 209, and the second gate structure 209 is located in the high-voltage element region 200.

The materials of the metal layer used to form the second gate electrode layer 207 and the metal electrode 317 may comprise titanium nitride, tantalum nitride, a copper aluminum alloy or another suitable conducting material. In some embodiments, the thickness of the metal layer used to form the second gate electrode layer 207 and the metal electrode 317 is in a range from about 200 Å to about 800 Å. In other embodiments, the thickness of the metal layer used to form the second gate electrode layer 207 and the metal electrode 317 is in a range from about 400 Å to about 600 Å.

Figure 6:
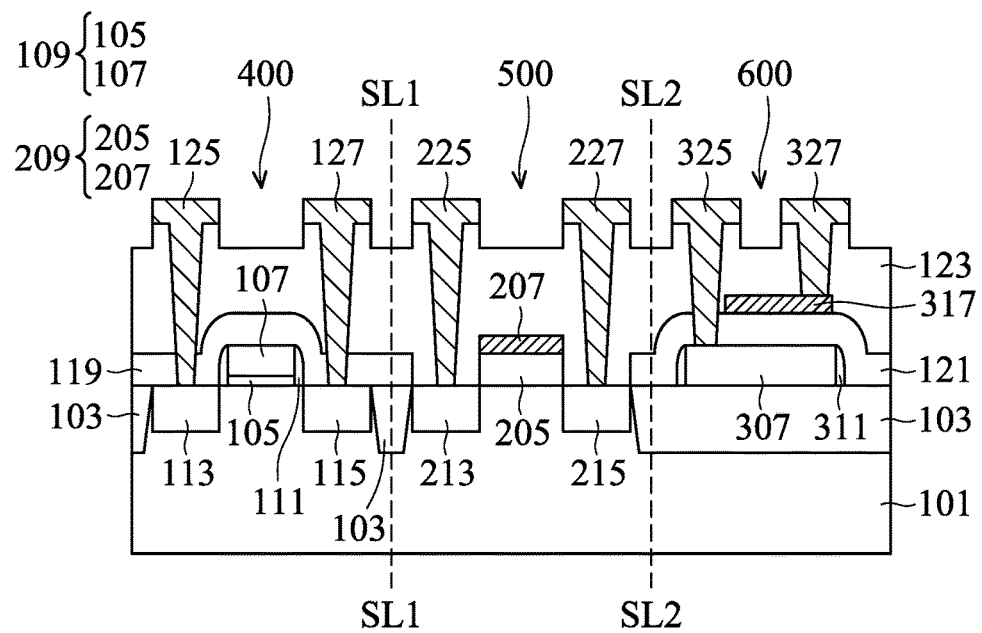

Next, as shown in FIG. 6, an inter-layer dielectric layer (ILD) 123 is formed on the semiconductor substrate 101. The inter-layer dielectric layer 123 is formed covering the insulating layer 119 in the low-voltage element region 100, the second source region 213, the second gate structure 209, and the second drain region 215 in the high-voltage element region 200, and the insulating layer 121 and the metal electrode 317 in the capacitor region 300. In some embodiments, the inter-layer dielectric layer 123 is formed by a deposition process, and the inter-layer dielectric layer 123 may comprise oxide, nitride, oxynitride or another suitable dielectric material.

Then, an etching process is performed to form some openings that are used to form contacts 125, 127, 225, 227, 325 and 327 subsequently) in the inter-layer dielectric layer 123 and the insulating layers 119, 121, so that a portion of the first source region 113, a portion of the first drain region 115, a portion of the second source region 213, a portion of the drain region 215, and a portion of the metal electrode 317 are exposed.

Next, a deposition process is performed to from a metal layer (not shown) in the openings and on the inter-layer dielectric layer 123. Then, a patterning process is performed on the metal layer, such as an etching process, to form contacts 125, 127, 225, 227, 325 and 327 as shown in FIG. 6. Moreover, a portion of the inter-layer dielectric layer 123 disposed around the contacts 125, 127, 225, 227, 325 and 327 is removed by the etching process. In some embodiments, the first source contact 125 and the first drain contact 127 penetrate the inter-layer dielectric layer 123 and the insulating layer 119 to be electrically connected to the first source region 113 and the first drain region 115 respectively.

The second source contact 225 and the second drain contact 227 penetrate the inter-layer dielectric layer 123 to be electrically connected to the second source region 213 and the second drain region 215 respectively. The contact 325 penetrates the inter-layer dielectric layer 123 and the insulating layer 121 to be electrically connected to the polysilicon electrode 307. The contact 327 penetrates the inter-layer dielectric layer 123 to be electrically connected to the metal electrode 317. In some embodiments, the metal layer can comprise metals or another suitable conductive material.

In addition, after the first source contact 125, the first drain contact 127, the second source contact 225, the second drain contact 227, the contacts 325 and 327 are formed, the processes of the semiconductor device comprising the low-voltage element 400, the high-voltage element 500 and the capacitor element 600. In some embodiments, the low-voltage element 400 is a transistor that can withstand low gate voltages, and the high-voltage element 500 is a transistor that can withstand high gate voltages.

In some embodiments, the first gate structure 109 is the gate structure of the low-voltage element 400, and the gate voltage of the first gate structure 109 is less than about 5 volts. The second gate structure 209 is the gate structure of the high-voltage element 500, and the gate voltage of the second gate structure 209 is in a range from about 6 volts to about 30 volts. The gate dielectric layer of the second gate structure 209 has a thickness greater than that of the gate dielectric layer of the first gate structure 109, for example, the thickness of the second gate dielectric layer 205 is greater than the thickness of the first gate dielectric layer 105, and the second gate structure 209 has a gate electrode layer made of metals, such as the second gate electrode layer 207.

Moreover, the capacitor element 600 is made up of the polysilicon electrode 307, the insulating layer 121 and the metal electrode 317, the polysilicon electrode 307 is used as a lower electrode of the capacitor element 600, the insulating layer 121 is used as a capacitor dielectric layer of capacitor element 200, and the metal electrode 317 is used as an upper electrode of the capacitor element 600.

In addition, in the present embodiment, since the second gate electrode layer 207 and the metal electrode 317 of the capacitor element 600 are made of metals, the second gate electrode layer 207 and the metal electrode 317 have thicknesses less than that of the electrodes made of polysilicon materials. The thicknesses of the second gate electrode layer 207 and the metal electrode 317 are in a range from about 200 Å to about 800 Å, and the thickness of the polysilicon electrode layer is in a range from about 1500 Å to about 3000 Å. Therefore, the thickness of the inter-layer dielectric layer 123 formed subsequently can be reduced. As a result, the aspect ratio (AR) of the openings for forming the contacts 125, 127, 225, 227, 325, and 327 of the low-voltage element 400, the high-voltage element 500, and the capacitor element 600 is reduced. Accordingly, the size of the semiconductor device is decreased, and quality and performance of the semiconductor device can be further improved.

Furthermore, when a electrode is formed of a polysilicon material, the polysilicon electrode needs to be doped, and a thermal densification process needs to be performed on an insulating layer (for example, the second gate dielectric layer 205 of the high-voltage element 500 and the insulating layer 121 of the capacitor element 600) under the polysilicon electrode. As a result, the element having the polysilicon electrode has high manufacturing cost and has high thermal budget. In contrast, according to some embodiments of the present disclosure, since the electrode is formed of a metal material, the doping and the thermal densification processes do not need to be performed anymore. Accordingly, the steps of the process are simplified, and the manufacturing cost and the thermal budget are reduced. In addition, features of the source/drain regions can be prevented from being affected by high-temperature processes.

Figure 7:
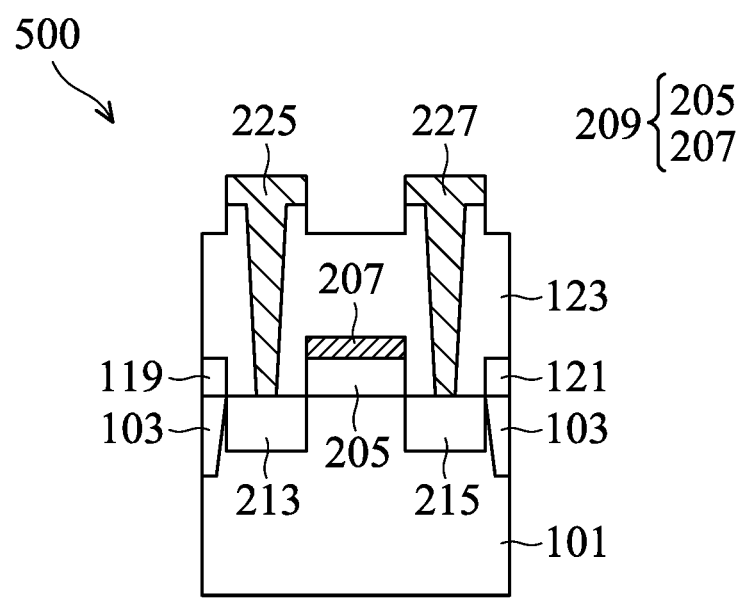
FIG. 7 is a cross-sectional view of a high-voltage element of a semiconductor device in accordance with some embodiments.

FIG. 7 is a cross-sectional view of the high-voltage element 500 of the semiconductor device in accordance with some embodiments. In some embodiments, the high-voltage element 500 can be obtained individually by performing a dicing process on the semiconductor device including the low-voltage element 400, the high-voltage element 500 and the capacitor element 600 along the scribe lines SL1 and SL2 as shown in FIG. 6.

Figure 8:
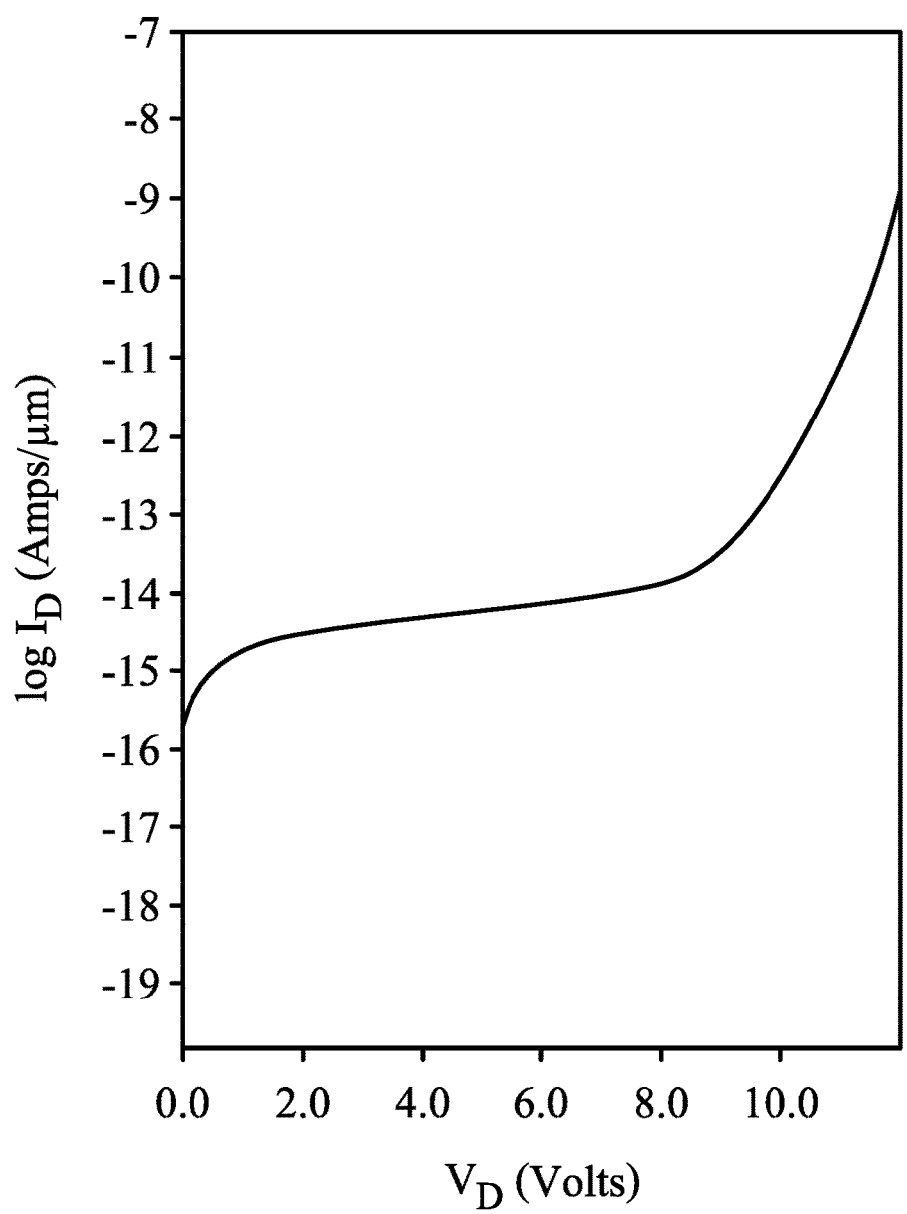
FIG. 8 is an electrical characteristics curve of a high-voltage element of a semiconductor device in accordance with some embodiments.

FIG. 8 is an electrical characteristics curve (logarithm of drain current ($I_D$) to drain voltage ($V_D$)) of the high-voltage element 500 of the semiconductor device in accordance with some embodiments. According to FIG. 8, when the drain voltage ($V_D$) is less than 8 volts, the drain current ($I_D$) of the high-voltage element 500 is a linear curve, which shows that the high-voltage element 500 is operated normally in both saturated region and unsaturated region. On the other side, when the drain voltage ($V_D$) is greater than 8 volts, the logarithm of the drain current ($I_D$) can reach −9 Amps/μm, which shows that the high-voltage element 500 can withstand higher breakdown voltages (Vb) in the breakdown region.

In the process of manufacturing the semiconductor device including a low-voltage element and a high-voltage element, the thickness of the gate dielectric layer required for the high-voltage element is greater than the gate dielectric layer required for the low-voltage element. Therefore, the gate dielectric layers of the two kinds of elements cannot be formed simultaneously in the same step of the process. In some embodiments, the thicker dielectric material layer is first formed. Then, a mask is formed in a specific region (for example, a high-voltage element region), and a portion of the dielectric material layer in the low-voltage element region is removed by using the mask as an etching mask. As a result, a thinner gate dielectric layer of the low-voltage element is formed. Since additional masks are required in the process, the manufacturing cost is increased.

Some embodiments of the present disclosure provide methods for forming high-voltage elements by parasitic method in the manufacturing process of semiconductor devices including metal-insulator-polysilicon (MIP) structures, for example, transistors that can withstand high gate voltages. In the manufacturing process, semiconductor devices including low-voltage elements, high-voltage elements and metal-insulator-polysilicon structures can be formed simultaneously. Meanwhile, the quantity of the masks needed during the process can be reduced, so that the manufacturing cost can be reduced significantly.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a first gate structure disposed on a semiconductor substrate, wherein the first gate structure comprises a first gate dielectric layer and a first gate electrode layer located thereon;
   a first insulating layer disposed on the semiconductor substrate, wherein the first gate structure and a portion of the semiconductor substrate are covered by the first insulating layer;
   a second gate dielectric layer disposed on the semiconductor substrate, wherein the first insulating layer and the second gate dielectric layer are formed by an insulating material layer, and the second gate dielectric layer has a thickness that is greater than a thickness of the first gate dielectric layer;
   a second gate electrode layer disposed on the second gate dielectric layer; and
   a capacitor element disposed on the semiconductor substrate, wherein the capacitor element comprises a polysilicon electrode and a second insulating layer located thereon, and wherein the polysilicon electrode and the first gate electrode layer are made of a polysilicon layer.

2. The semiconductor device as claimed in claim 1, wherein the capacitor element further comprises a metal electrode disposed on the second insulating layer, and the metal electrode and the second gate electrode layer are made of a metal layer.

3. The semiconductor device as claimed in claim 2, wherein the metal layer comprises titanium nitride, tantalum nitride or a copper aluminum alloy.

4. The semiconductor device as claimed in claim 1, wherein the second gate dielectric layer and the second gate electrode layer constitute a second gate structure, the first gate structure is a gate structure of a low-voltage element, and the second gate structure is a gate structure of a high-voltage element.

5. The semiconductor device as claimed in claim 1, wherein the first insulating layer and the second gate dielectric layer comprise an oxynitride layer, an oxide layer or a structure of stacked oxide-nitride-oxide layers.

6. The semiconductor device as claimed in claim 5, further comprising:
   a source region and a drain region disposed in the semiconductor substrate, wherein the source region and the drain region are respectively located on opposite sides of the second gate structure;
   an interlayer dielectric layer covering the first insulating layer and the second gate structure; and
   a source contact and a drain contact penetrating through the interlayer dielectric layer, wherein the source contact and the drain contact are electrically connected to the source region and the drain region respectively.

7. A method for manufacturing the semiconductor device as set forth in claim 1, comprising:
   forming the first gate structure on the semiconductor substrate, wherein the first gate structure comprises the first gate dielectric layer and the first gate electrode layer formed thereon;
   forming the insulating material layer on the semiconductor substrate, wherein the semiconductor substrate and the first gate structure are covered by the insulating material layer;
   removing a portion of the insulating material layer in a high-voltage element region to form the second gate dielectric layer in the high-voltage element region on the semiconductor substrate, wherein the second gate dielectric layer has the thickness that is greater than the thickness of the first gate dielectric layer;

forming the second gate electrode layer on the second gate dielectric layer; and forming the capacitor element on the semiconductor substrate, wherein the capacitor element comprises the polysilicon electrode, and the polysilicon electrode and the first gate electrode are formed in a same step of a process.

8. The method as claimed in claim 7, wherein the second gate dielectric layer and the second gate electrode layer constitute a second gate structure, the first gate structure is a gate structure of a low-voltage element, and the second gate structure is a gate structure of a high-voltage element.

9. The method as claimed in claim 7, wherein the insulating material layer is formed by a deposition process, and the insulating material layer has a thickness in a range from 300 Å to 1200 Å.

10. The method as claimed in claim 7, further comprising:

forming a first source region and a first drain region in a low-voltage element region in which the first gate structure is located, and forming a second source region and a second drain region in the high-voltage element region before forming the insulating material layer.

11. The method as claimed in claim 10, wherein the first source region, the first drain region, the second source region, the second drain region, and the semiconductor substrate between the second source region and the second drain region are covered by the insulating material layer before forming the second gate dielectric layer.

12. The method as claimed in claim 11, wherein the step of forming the second gate dielectric layer comprises performing an etching process to remove the portion of the insulating material layer covering the second source region and the second drain region, and forming the first insulating layer on the first gate structure.

13. The method as claimed in claim 12, further comprising:

forming an interlayer dielectric layer on the first insulating layer and the second gate electrode layer; and forming a first source contact, a first drain contact, a second source contact and a second drain contact penetrating through the interlayer dielectric layer, wherein the first source contact and the first drain contact are electrically connected to the first source region and the first drain region respectively, and the second source contact and the second drain contact are electrically connected to the second source region and the second drain region respectively.

14. The method as claimed in claim 7, further comprising:

forming an isolation structure in the semiconductor substrate, wherein the capacitor element is formed on the isolation structure, wherein forming the second gate dielectric layer comprises performing an etching process to remove the portion of the insulating material layer covering the second source region and the second drain region, and forming a second insulating layer on the polysilicon electrode.

15. The method as claimed in claim 14, wherein the capacitor element further comprises a metal electrode formed on the second insulating layer, and the metal electrode and the second gate electrode layer are formed in the same step of the process.

16. A semiconductor device, comprising:

a gate dielectric layer disposed on a semiconductor substrate;

a metal gate electrode layer disposed on the gate dielectric layer, wherein the gate dielectric layer and the metal gate electrode layer constitute a gate structure;

a source region and a drain region respectively disposed on opposite sides of the gate structure, wherein the gate structure is a gate structure of a high-voltage element;

a polysilicon electrode disposed on the semiconductor substrate;

an insulating layer disposed on the polysilicon electrode, wherein the insulating layer and the gate dielectric layer are made of an insulating material layer; and a metal electrode disposed on the insulating layer, wherein the metal electrode and the metal gate electrode layer are made of a metal layer.

17. The semiconductor device as claimed in claim 16, wherein the gate structure has a gate voltage in a range from 6 volts to 30 volts, and the gate dielectric layer has a thickness in a range from 300 Å to 1200 Å.

* * * * *